United States Patent
Park

[19]

[11] Patent Number: 6,091,106
[45] Date of Patent: Jul. 18, 2000

[54] LOW VOLTAGE TRANSISTOR STRUCTURE HAVING A GROOVED GATE

[75] Inventor: Sung Kye Park, Chungcheongbuk-do, Rep. of Korea

[73] Assignee: LG Semicon Co., Ltd., Cheongju-Si, Rep. of Korea

[21] Appl. No.: 08/957,781

[22] Filed: Oct. 24, 1997

[30] Foreign Application Priority Data

Nov. 8, 1996 [KR] Rep. of Korea ........................ 96/52735

[51] Int. Cl.⁷ ................................................ H01L 29/76
[52] U.S. Cl. .......................... 257/330; 257/396; 257/401; 257/407; 257/622; 438/259
[58] Field of Search ..................... 257/314, 330, 257/389, 392, 401, 402, 407, 622, 396; 438/259, 275

[56] References Cited

U.S. PATENT DOCUMENTS 5,208,173  5/1993  Yamada et al. ........................ 438/264
5,285,096  2/1994  Ando et al. ............................ 257/379
5,831,323  11/1998 Motonami et al. .................... 257/506
5,905,283  5/1999  Kasai ..................................... 257/334

FOREIGN PATENT DOCUMENTS

355166959  12/1980  Japan ............................ H01L 29/78

*Primary Examiner*—Mahshid Saadat
*Assistant Examiner*—George C. Eckert, III

[57] ABSTRACT

Disclosed is a transistor structure having a semiconductor substrate with a active region and a field region, a recess region being defined by either the field region or the active region, a gate electrode formed on portions of the active and recess region, and impurity regions formed in the active region of the semiconductor substrate on either side of the gate electrode. The transistor structure has an active region with at least one groove formed therein, and the transistor structure being formed for a low voltage operation.

14 Claims, 13 Drawing Sheets

LOW VOLTAGE TRANSISTOR STRUCTURE HAVING A GROOVED GATE

BACKGROUND OF THE INVENTION

1. Field of the Invention

The present invention relates to a transistor structure and its fabricating method thereof, and particularly, to a transistor structure which is constructed for a LOW voltage operation.

2. Discussion of Related Art

Figure 1:
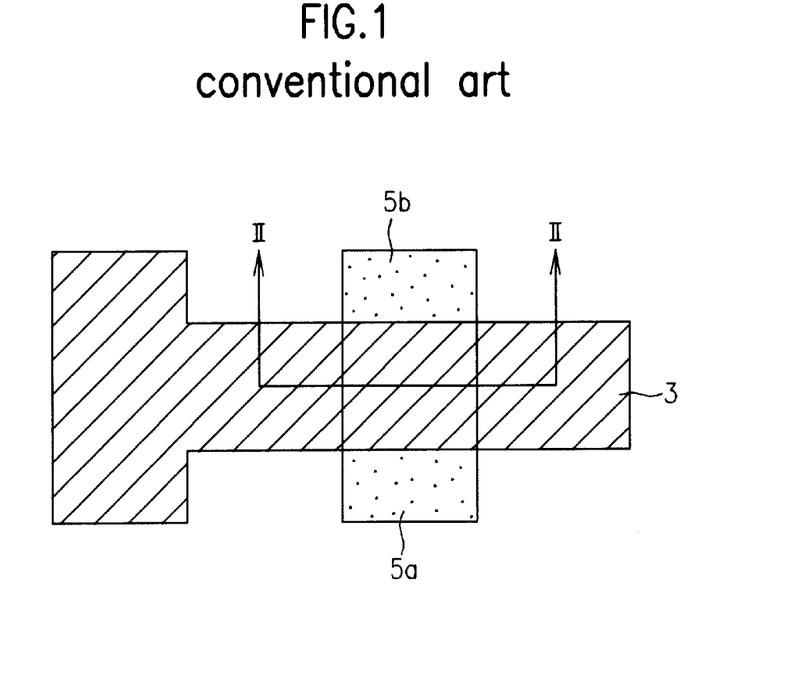
FIG. 1 is a layout of a conventional unit transistor.
Figure 2:
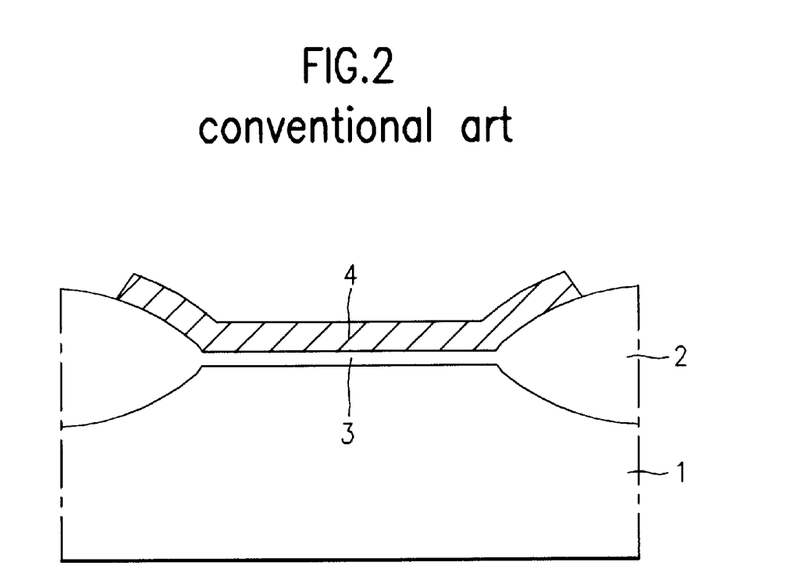
FIG. 2 is a cross sectional view taken in the direction of the arrows along the arcuate line II—II of FIG. 1.
Figure 3:
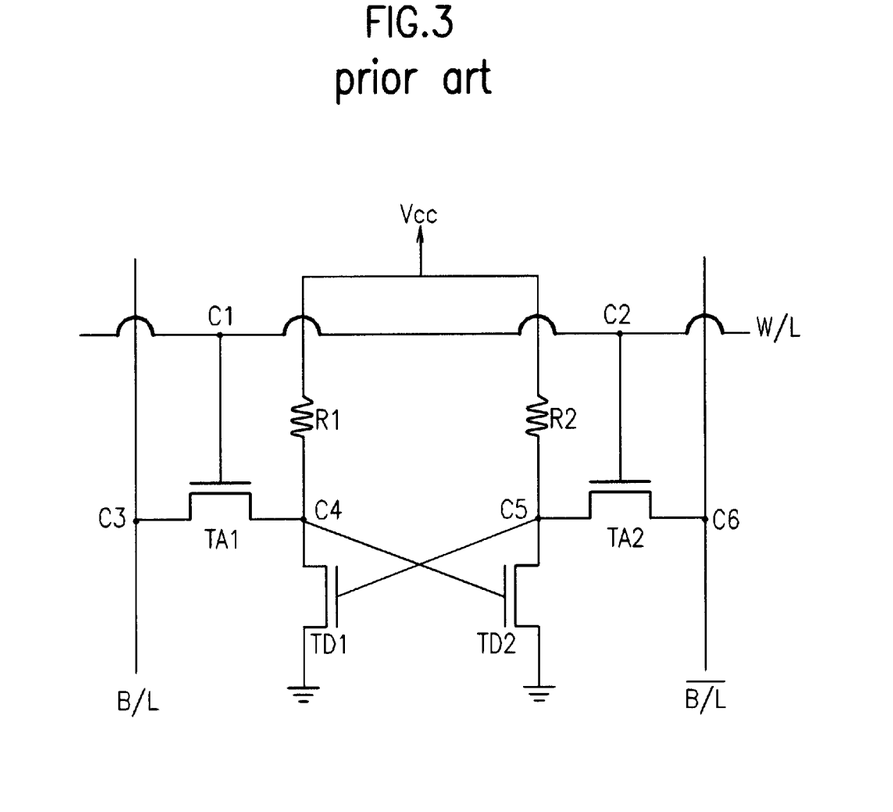
FIG. 3 is a circuit diagram of a prior art SRAM cell.
Figure 4:
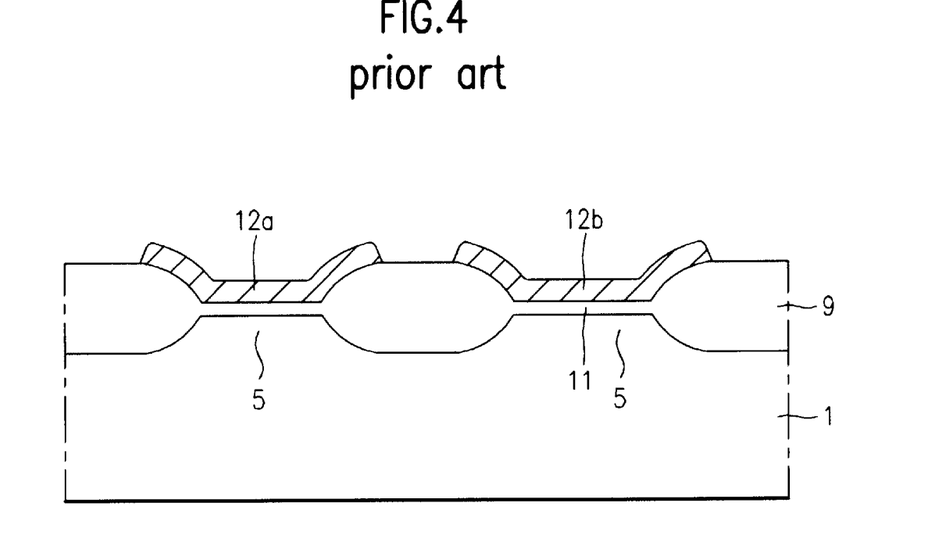
FIG. 4 is a cross sectional view, having the same perspective as FIG. 2, showing the structure of access and drive transistors of a conventional SRAM cell.

FIG. 1 is a layout of a conventional unit transistor and FIG. 2 is a cross sectional view taken in the direction of the arrows along the line II—II of FIG. 1. Further, FIG. 3 is a circuit diagram of a prior art SRAM cell and FIG. 4 is a cross sectional view, having the same perspective as FIG. 2, showing the structure of the access and drive transistors of a conventional SRAM cell. In addition, FIGS. 5a–5d are diagrams illustrating the method of fabricating the access and drive transistors of the conventional SRAM cell.

A conventional unit transistor, as shown in FIGS. 1 and 2, include a substrate 1 which defines a field region and an active region, a field oxide layer 2 formed on the surface of the field region of the substrate 1, a gate oxide layer 3 and a gate electrode 4 laminated on the active region, and first and second impurity regions 5a and 5b serving as the source and drain of the transistor disposed in a predetermined region of the substrate on each side of the gate electrode 4. Accordingly in FIG. 2, the impurity diffused regions 5a and 5b would extend out from the page and extend into the page.

A prior art access and drive transistor structure of a prior art SRAM, as shown in FIG. 4, includes a substrate 1 which defines an active region 5, a field region and a field oxide layer 9 formed thereon, a gate oxide layer 11 formed on a respective active region which are separated by a field oxide layer 9, and a gate electrode 12a of the access transistor and a gate electrode 12b of the drive transistor which are laminated on the gate oxide layers 11.

Figure 5A:
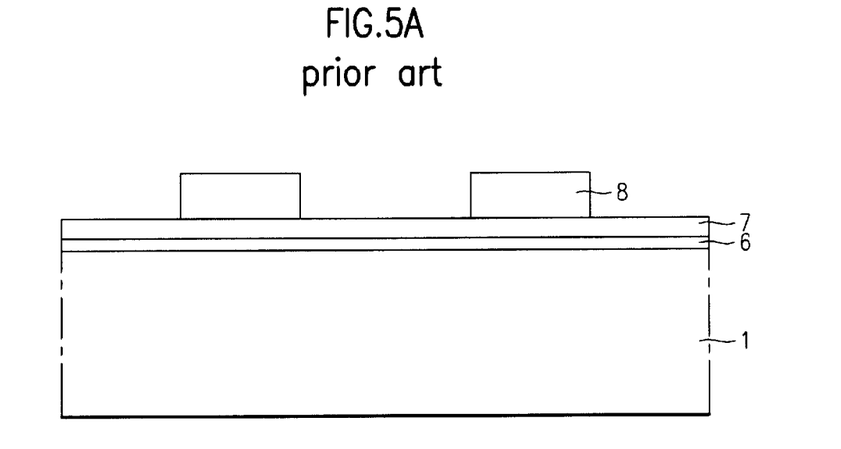
FIGS. 5a–5d are diagrams illustrating the method of fabricating the access and drive transistors of the conventional SRAM cell.

Referring to FIG. 5a, a first pad oxide layer 6 and a nitride layer 7 are sequentially deposited on the whole surface of the substrate 1. Then, a first photoresist 8 is deposited on the whole surface of the nitride layer 7 and selectively patterned by a photoetching and development method.

Figure 5B:
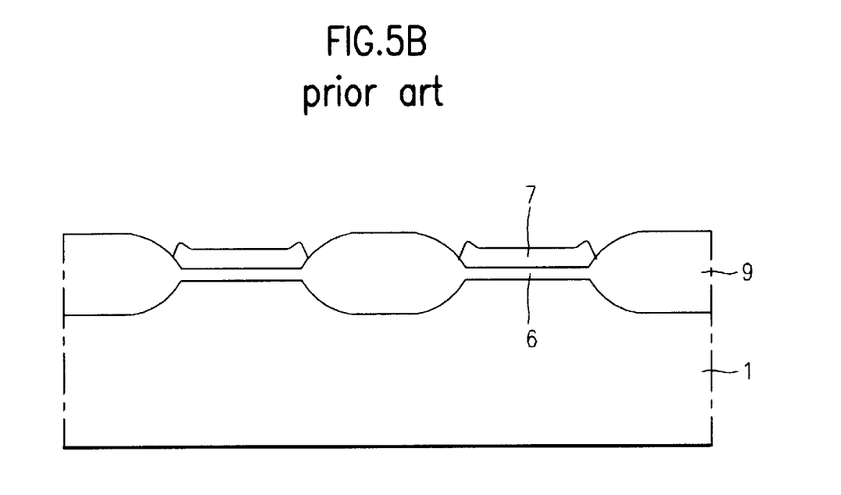

In FIG. 5b, the patterned photoresist 8 is used as a mask for performing anisotropic etching on the exposed nitride layer 7 and then the photoresist 8 is removed. Next, the field oxide layer 9 is deposited on the substrate 1 by a thermal oxidation method using the remaining nitride layer 7 as a mask, and the active region of the access transistor is separated from that of the drive transistor.

Figure 5C:
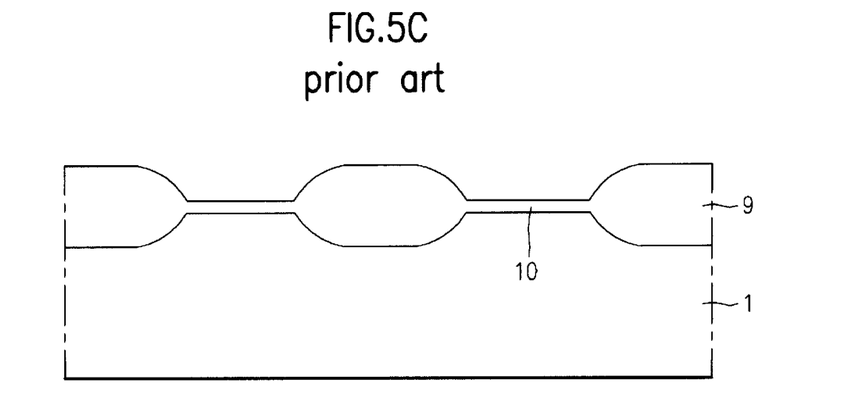

As shown in FIG. 5c, after the nitride layer 7 and the first pad oxide layer 6 are removed, a second pad oxide layer 10 is deposited by a thermal oxidation or a chemical vapor deposition method. The second pad oxide layer 10 is removed after performing an implantation of channel stop ions in the active regions of the access and drive transistors.

Figure 5D:
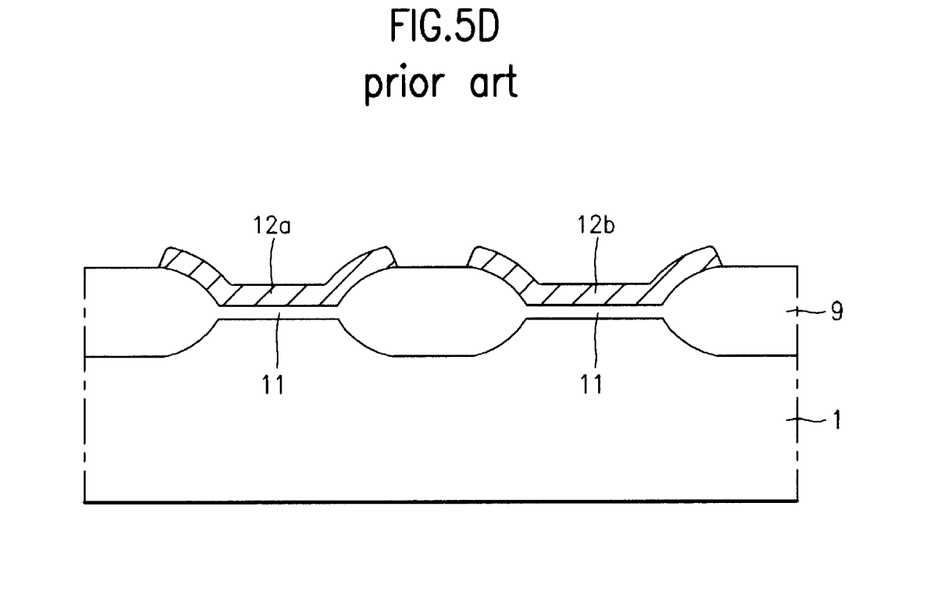

In FIG. 5d, an oxide layer is deposited by a heat oxidation or a chemical vapor deposition method. Then, a polysilicon layer is deposited on the oxide layer, which is doped with an impurity. A second photoresist is paved on the polysilicon layer and selectively patterned by means of an exposure and a development method. Then, the polysilicon layer and the oxide layer are sequentially removed by using the patterned second photoresist as a mask. A gate electrode 12a of an access transistor and a gate electrode 12b of a drive transistor are then laminated on the gate oxide layer 11 which is formed on the active region. Finally, the second photoresist is removed.

FIG. 3 is a circuit diagram of a prior art SRAM cell illustrating a write/read operation. The write operation includes writing a high voltage at the contact region C4 to achieve a "1" state (i.e., a HIGH node) and writing a low voltage at the contact region C5 to achieve a "0" state (i.e., a LOW node). The read operation determines whether the cell is a HIGH node or a LOW node by sensing a voltage difference on the bit line B/L and the bit bar line $\overline{(B/L)}$.

To write a HIGH voltage to a fourth contact region C4, $V_{CC}$ is applied to a bit line B/L and the gate of a first access transistor TA1 which is connected to a word line W/L. Because of the applied $V_{CC}$, the first access transistor TA1 is turned on and the $V_{CC}$ of the bit line B/L is stored in the forth contact region C4.

To write a LOW voltage to a fifth contact region C5, '0 V' is applied to a bit bar line $\overline{(B/L)}$ and $V_{CC}$ voltage is applied to the gate of a second access transistor TA2 which is connected to the word line W/L. Because of the applied $V_{CC}$, the second access transistor TA2 is turned on and the LOW voltage of 0 V of the bit bar line $\overline{(B/L)}$ is written to the fifth contact region C5.

To read the HIGH voltage written at the fourth contact region C4, $V_{CC}$ voltage is applied to the gates of the first and second access transistors TA1 and TA2 which are connected to the word line W/L. In the state the $V_{CC}$ voltage stored at the fourth contact region C4 transfers to the bit line B/L and the 0 V voltage stored at the fifth contact region C5 transfers to the bit bar line $\overline{(B/L)}$, $V_{CC}$ voltage is fixed on the bit line B/L and 0 V voltage is fixed on the bit bar line $\overline{(B/L)}$, and a sensing amplifier senses the difference between these two voltages so as to determine which is a HIGH node or a LOW node.

While the forth contact region C4 and the fifth contact region C5 store the HIGH voltage and the LOW voltage, respectively, a second drive transistor TD2 is turned on and a first drive transistor TD1 is turned off. Because the second access transistor TA2 is turned on due to the $V_{CC}$ voltage applied to the word line W/L and a LOW voltage of the fifth contact region C5, the LOW voltage of the fifth contact region C5 passes from the bit bar line $\overline{(B/L)}$ through the second access transistor TA2 and the second drive transistor TD2 which is on due to the high voltage stored at the fourth contact region C4.

The LOW voltage of the fifth contact region C5 is determined by the resistance ratio of the second access transistor TA2 to the second drive transistor TD2 in the process. Therefore, to maintain the initial LOW voltage of the fifth contact region C5, the driving capability of the second drive transistor TD2 has to be three times as large of that of the second access transistor TA2.

Consequently, to maintain the initial voltage of the fifth contact region C5 during a read operation of the LOW node, a reduced current driving capability for a second access transistor is required and an increased current driving capability for a second drive transistor is required. Considering the dimensions of the access and drive transistors, the threshold voltage of the second access transistor TA2 needs to be increased and that of the second drive transistor TD2 needs to be reduced.

Contrary to maintaining a LOW node, in order to maintain the initial HIGH voltage at the forth contact region C4 during a read operation of the HIGH node, it is necessary to decrease the threshold voltage of the first access transistor TA1 and increase the threshold voltage of the first drive transistor TD1.

As described above, for a stable read operation, the threshold voltage of the access transistor at a LOW node is to be increased and that of the drive transistor is to be decreased so as to secure an operational margin of a stable low-voltage SRAM cell. However, it is difficult to secure an operational margin for a low operation voltage using the conventional access transistor.

The problems presented by the conventional transistor may be summarized as follows.

First, it is difficult to fabricate access and drive transistors which have characteristics opposite to each other during a write and read operation of a single cell SRAM.

Second, fabrication methods that will lower the threshold voltage of the access transistor in a HIGH node and increase the threshold voltage in a LOW node are not applicable to conventional SRAM transistor channels forming a SRAM cell needed to operate with a low voltage power source.

SUMMARY OF THE INVENTION

Accordingly, the present invention is directed to a method of fabricating a transistor that substantially obviates one or more of the problems due to limitations and disadvantages of the related art.

An object of the present invention is to provide a method of fabricating a transistor which is suitable for securing an operational margin when powered by a low voltage.

To achieve these and other advantages and in accordance with the purpose of the present invention, as embodied and broadly described, the structure of a transistor, comprises a semiconductor substrate having an active region formed therein and a field oxide region formed thereon and at least one of said active region and field oxide region defining a recess region; a gate electrode formed on a portion of said active region and a portion of said recess region; and impurity regions formed on either side of said gate electrode in said active region.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENT

Reference will now be made in detail to the preferred embodiments of the present invention, examples of which are illustrated in the accompanying drawings.

Figure 6:
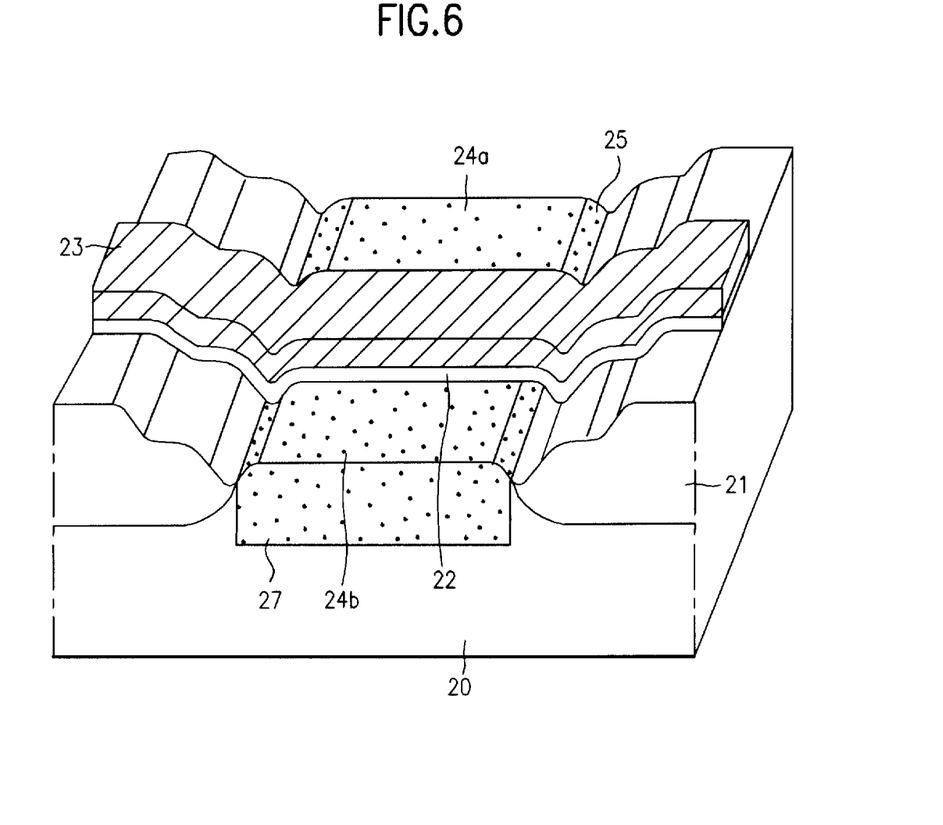
FIG. 6 is a perspective view taken along the line II—II of FIG. 1, showing the transistor according to a first preferred embodiment of the present invention.

Referring to FIG. 6, which is a perspective view taken along a line II—II of FIG. 1 and showing a transistor according to the first preferred embodiment of the present invention, shows a substrate 20 having an active region 27 and a field region with a field oxide layer 21 formed thereon. The active region 27 and the field region along with the field oxide layer 21 defines an edge portion 25 as a recess or cavity along the border of the active region 27 and a field oxide layer 21.

A gate oxide layer 22 and a gate electrode 23 are formed so as to cover a portion of the depressed edges of the field oxide layer 21, a portion of active region 27, and a portion of the edge portion 25. Further, there are formed first and second impurity regions 24a and 24b in the active region 27 including the active region part of the edge portion 25. The first and second impurity regions 24a and 24b are disposed in a predetermined region of the substrate 20 on each side of the gate electrode 23 which serve as the source and drain of the transistor. Also, because the gate electrode 23 is formed across a portion of the active region, a main channel is capable of being formed in the active region between the source and drain and an edge channel is capable of being formed along the active region portion of the edge portion 25 between the source and drain.

Figure 7:
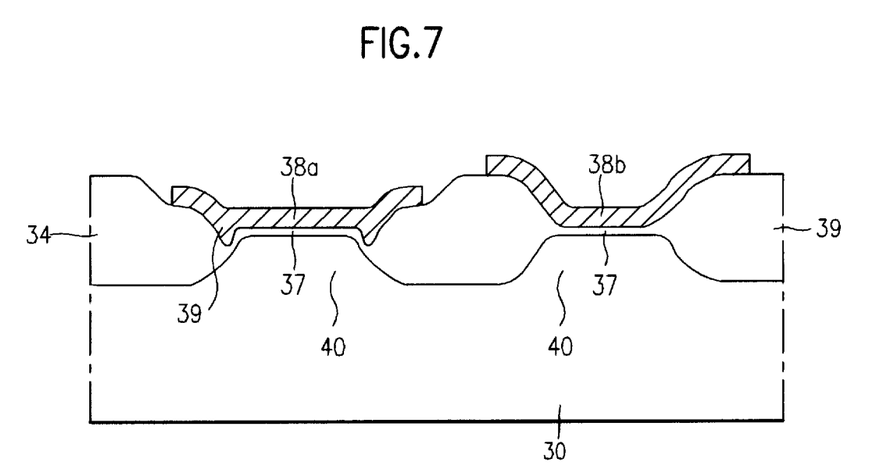
FIG. 7 is a cross sectional view, having the same perspective as FIG. 6, showing the structure of the access and drive transistors of an SRAM cell according to a second preferred embodiment of the present invention.

FIG. 7 is a cross sectional view showing the structure of the access and drive transistors of the SRAM cell according to a second preferred embodiment of the present invention, and FIGS. 8a–8e are diagrams illustrating the method of fabricating the access and drive transistors of FIG. 7.

As to FIG. 7, on an active region 40 next to a field oxide layer 34, a gate oxide layer 37 and a gate electrode 38b of a drive transistor are formed in lamination. Further, the edge of a field oxide layer 34 adjacent to a side of the active region defines a recess or cavity region 39. A portion of the depressed edges of the field oxide layer 34 and a portion of the recess or cavity region 39 are covered with the gate oxide layer 37 and a gate electrode 38a of the access transistor.

Figure 8A:
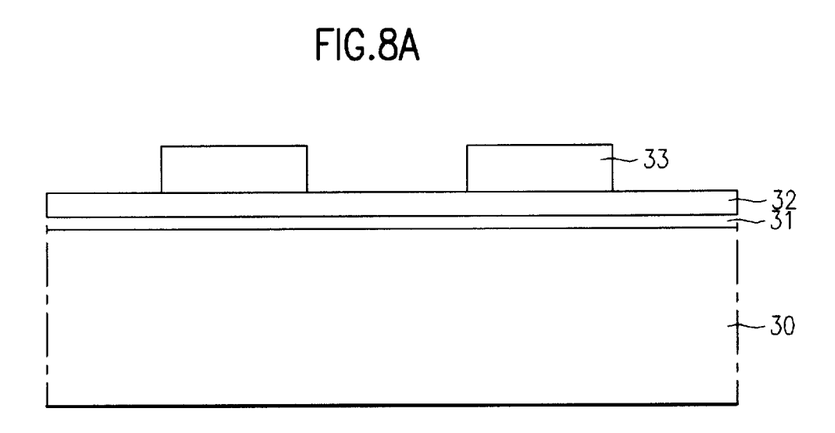
FIGS. 8a–8e are diagrams illustrating the method of fabricating the access and drive transistors of the SRAM cell according to the second preferred embodiment of the present invention.

In the method of fabricating the access and drive transistors of the SRAM cell according to the second preferred embodiment of the present invention, a first pad oxide layer 31 and a nitride layer 32 are sequentially deposited on the whole surface of a substrate 30, as shown in FIG. 8a. After paving a first photoresist 33 on the whole surface of the nitride layer 32, the first photoresist 33 is selectively patterned by a photo-etching and a development method.

Figure 8B:
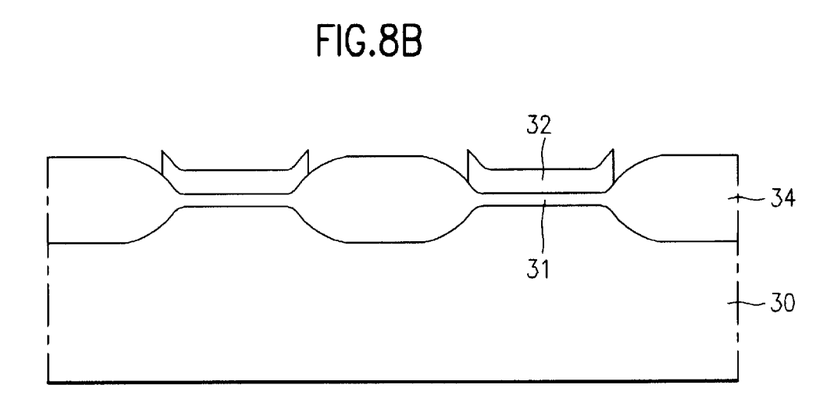

In FIG. 8b, anisotropic etching is carried out on the exposed nitride layer 32 by using the patterned photoresist 33 as a mask and the first photoresist 33 is then removed. After the anisotropic etching, the remaining nitride layer 32 is used as a mask in forming the field oxide layer 34 on the substrate 30 by a heat treatment method so as to separate the active region of the access transistor from that of the drive transistor.

Figure 8C:
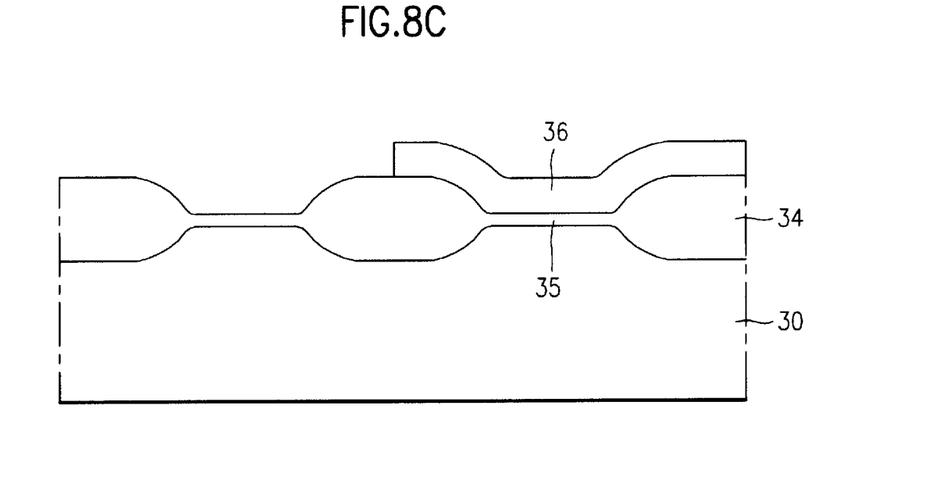

Referring to FIG. 8c, after the nitride layer 32 and the first pad oxide layer 31 are removed, there is formed a second pad oxide layer 35 by a thermal oxidation or a chemical vapor deposition method. Then, channel stop ions are implanted into the active regions of the access and drive transistors. In succession, a second photoresist is paved and only a part of the photoresist 36 that will form the access transistor is selectively removed by an exposure and a development method.

Figure 8D:
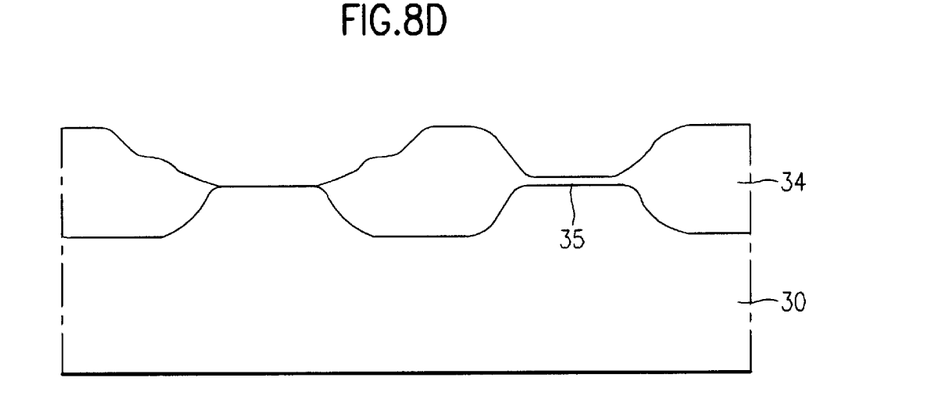

In FIG. 8d, the remaining photoresist 36 is used as a mask in performing anisotropic etching on the exposed second pad oxide layer 35 and then the photoresist 36 is removed.

Figure 8E:
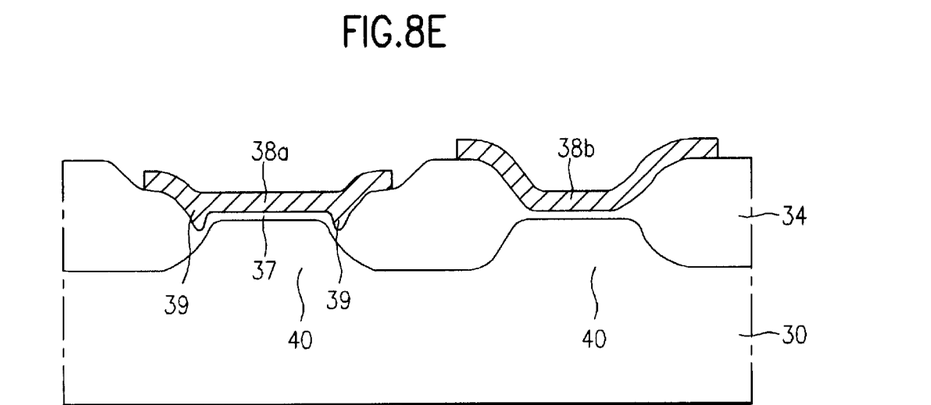

In FIG. 8e, the second pad oxide layer 35 remaining on the drive transistor is processed by anisotropic etching without a mask. After the anisotropic etching, a recess or cavity region 39 is formed along the edge of the field oxide layer 34 adjacent to an active region 40. Then, an oxide layer is deposited by a thermal oxidation or a chemical vapor deposition method so as to form the gate oxide layer 37 of the access and drive transistors.

Next, a polysilicon layer is deposited and doped. The doped polysilicon is paved with a third photoresist and the photoresist is selectively patterned by an exposure and a development method. Then, a gate electrode 38a of the access transistor and a gate electrode 38b of the drive transistor are formed by using the patterned photoresist as a mask. By this process the polysilicon layer is etched so as to include the upper part of the recess or cavity region 39 of the field oxide layer 34 adjacent to the active region on one side of the field oxide layer 34. Then, a source/drain region (not shown) is formed by implanting an impurity on the substrate on each side of the gate electrode 38a of the access transistor and the gate electrode 38b of the drive transistor. Accordingly, in FIG. 8e the implanted impurities on both sides of the gate electrodes 38a and 38b would extend out from the page and extend into the page.

Figure 9A:
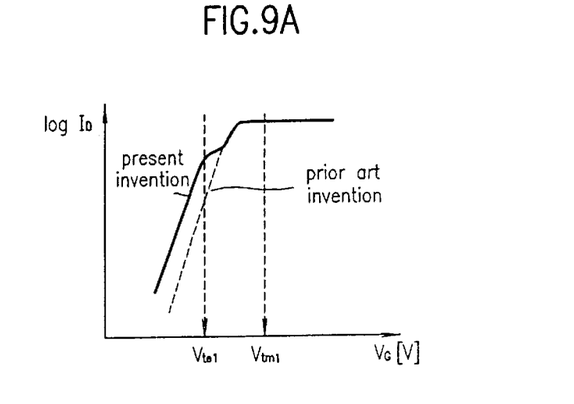
FIGS. 9a–9c are graphical representations showing the current-voltage relationship for the access transistor of the SRAM according to the second preferred embodiment of the present invention.
Figure 9B:
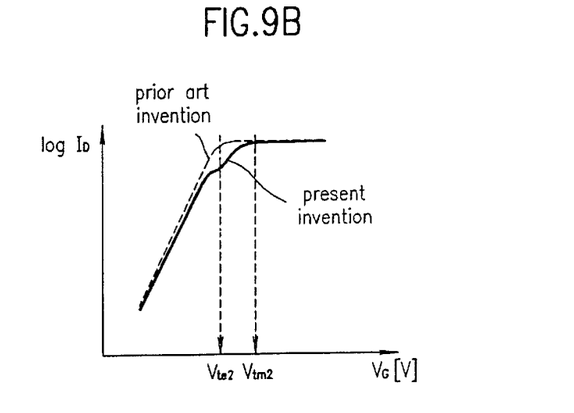
Figure 9C:
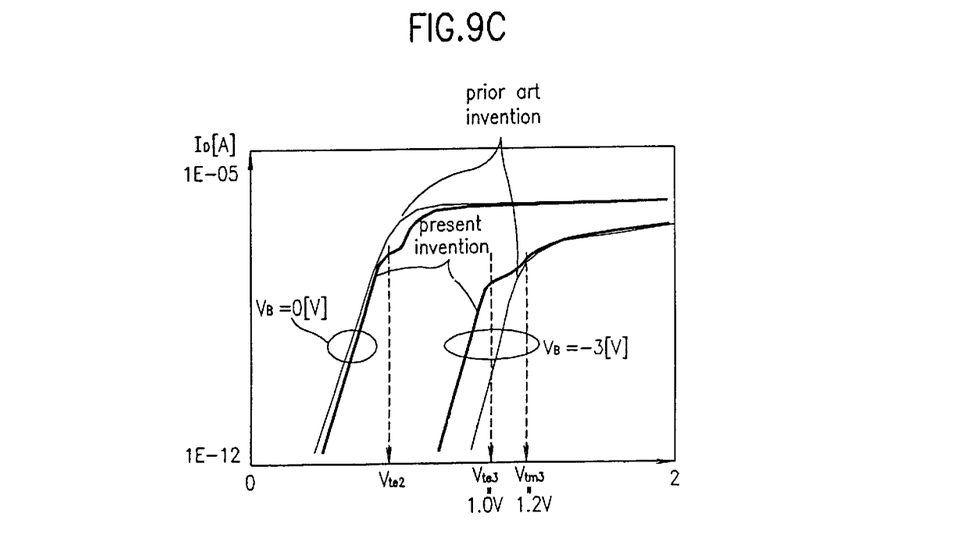

FIG. 1 is a layout of a conventional unit transistor and FIG. 3 is a circuit diagram of a prior art SRAM cell. Further, FIGS. 9a–9c are graphical representations showing the current-voltage relationship for the access transistor of a SRAM cell according to the second preferred embodiment of the present invention.

When a HIGH voltage is written to a forth contact region C4 and a LOW voltage is written to a fifth contact region C5, as discussed with respect to the operation of the circuit of the prior art SRAM of FIG. 3, $V_{CC}$ is applied to a first contact region C1 via the word line W/L. Meanwhile VCC is also applied to the bit line B/L such that the bit bar line $\overline{(B/L)}$ is in a '0' voltage state.

The high voltage of the forth contact region C4 is determined by the threshold voltage and a body effect γ of the first access transistor, which is represented by the equation $V_H = V_{CC} - V_{ta} \times (V_B) = V_{CC} - [V_{ta} + \gamma(2\phi_f - V_B)^{1/2}]$, where $V_{ta}$ is the threshold voltage when the breakdown voltage $V_B$ of the access transistor is '0' V, (i.e., $V_B$ is the reverse bias voltage between the source region of the access transistor and the substrate) and $2\phi_f$ is the potential of the source region. As a result, it is preferable to have $V_{ta}$ and γ low so as to have a higher voltage in the forth contact region C4.

Contrary to having a high voltage at the fourth contact region C4, the fifth contact region C5 stores a low voltage. Because of the application of the $V_{CC}$ voltage to the second contact region C2 via the word line W/L, the second access transistor TA2 is turned on. Accordingly, a '0' voltage from the bit bar line $\overline{(B/L)}$ is applied to the fifth contact region C5.

It is apparent that the threshold voltage of the second access transistor TA2 should be increased so as to obtain a lower voltage in this LOW node, i.e., representing a "0" logic state.

As shown in FIG. 9a, when the transistor structure of the present invention, e.g., FIG. 7, is implanted with channel ions having a prior art concentration, a turn on voltage ("threshold voltage") of an edge channel $V_{te1}$ is lower than a threshold voltage of a main channel $V_{tm1}$, wherein the main channel is a channel at the center of the active region and the edge channel being the remainder of the active region. Because the edge channel threshold voltage $V_{te1}$, is lower than the main channel threshold voltage $V_{tm1}$, a hump characteristic is illustrated relating to an edge channel having a current flow prior to the main channel. Also, the threshold voltage difference between $V_{te1}$ and $V_{tm1}$ allows current to flow in the edge channel at a distinct period prior to a current flow in the main channel. This has the disadvantage of increasing leakage current due to the current flow in the edge channel which makes low power operation difficult.

To solve the above problem, as shown in FIG. 9b, the present invention uses a higher implanted ion concentration than the prior art so that the threshold voltage of the edge channel and the main channel increase while decreasing current flow.

Because of the higher implanted ion concentration, the threshold voltage of the edge channel of the present invention increases to $V_{te2}$ and the threshold voltage of the main channel increases to $V_{tm2}$ wherein $V_{te2}$ is equal to the threshold voltage of the main channel $V_{tm1}$ at the prior art ion concentration. Also, the threshold voltage of the main channel $V_{tm2}$ at the higher ion implant concentration is larger than the threshold voltage of $V_{tm1}$ using the lower prior art concentration, and the threshold voltage difference between the edge channel and main channel has decreased (i.e., the difference between $V_{te2}$ and $V_{tm2}$ is smaller than the difference between $V_{te1}$ and $V_{tm1}$). Because of the decreased threshold voltage difference, current flows in the edge channel and main channel at approximately the same period thereby decreasing the amount of leakage current from an isolated edge channel current flow. In addition, the requirement of lowering the voltage at a LOW node by increasing the threshold voltage of a second access transistor TA2 is obtained because $V_{tm2}$ is now higher than $V_{tm1}$.

Referring to FIG. 9c, the curves in the circle labelled $V_b=0[V]$ represent the voltage/current curves of FIG. 9b where the threshold voltage of the present invention was increased by ion implantation. As the doping of the ion implantation for adjusting the threshold voltage increased even more, the reverse bias voltage changes from $V_b=0$ to $V_b=-3$ V. Consequently, the threshold voltage increases and current flow decreases. As illustrated by the curves labelled present invention in the circles labelled $V_b=0[V]$ and $V_b=-3[V]$, the edge channel threshold voltage $V_{te3}$ increases from $V_{te2}$ and the main channel threshold voltage increases to $V_{tm3}$. Furthermore, assuming a prior art transistor could achieve a $V_b$ of $-3$ V, a prior art voltage/current relationship could be described by the curve labelled prior art in the circle labelled Vb=-3[V].

Thus, the overall effect is that the present invention curve at $V_b=0[V]$ shifts to the present invention curve at $V_b=-3[V]$ which provides for a higher threshold voltage and lower current.

Figure 10A:
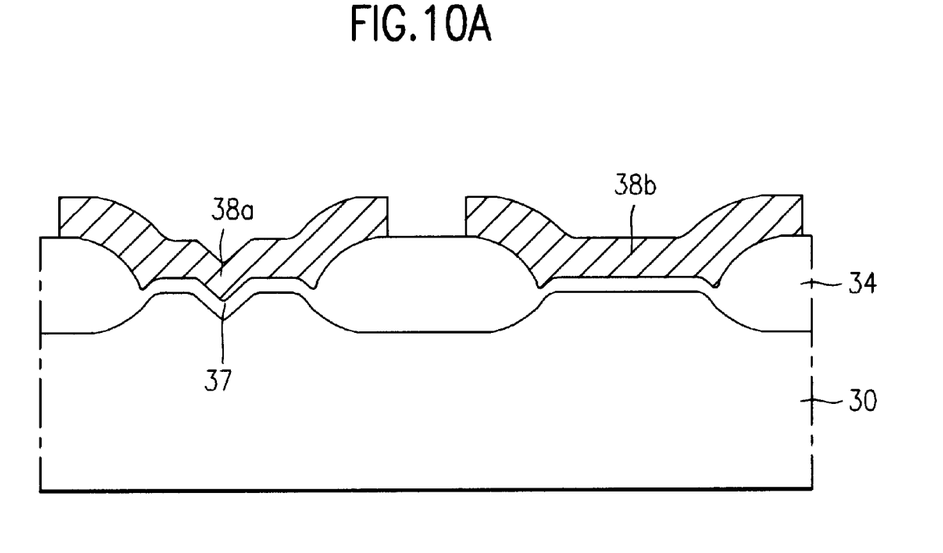
FIG. 10a is a cross sectional view, having the same perspective as FIG. 6, showing the structure of the access and drive transistors of an SRAM cell according to a third preferred embodiment of the present invention.
Figure 10B:
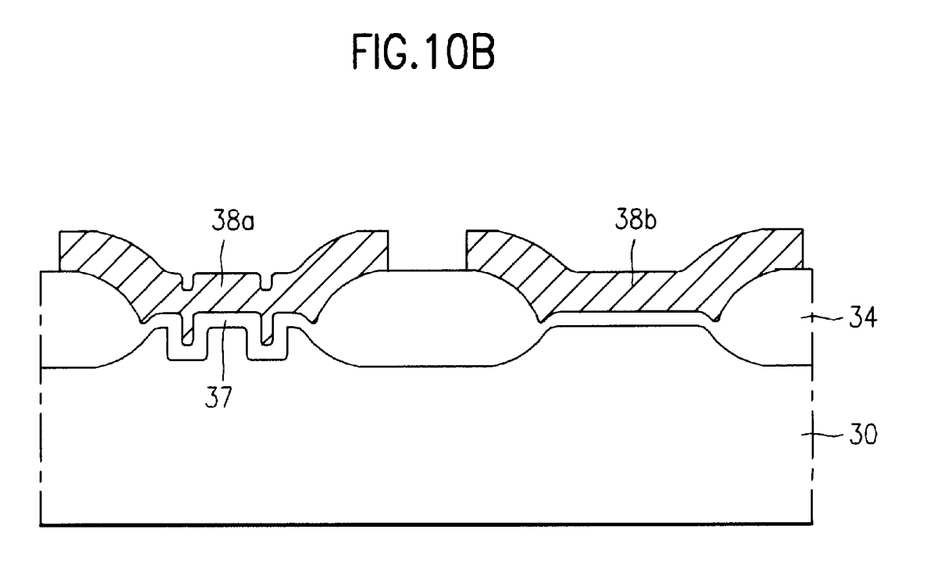
FIG. 10b is a cross sectional view, having the same perspective as FIG. 6, showing the structure of the access and drive transistors of an SRAM cell according to a forth preferred embodiment of the present invention.

FIGS. 10a and 10b are cross sectional views showing the structures of the access and drive transistors of an SRAM cell according to third and forth preferred embodiments of the present invention, respectively. Further, FIGS. 11a–11e are diagrams illustrating the method of fabricating the access and drive transistors of the SRAM cell according to the third preferred embodiment of the present invention.

In FIG. 10a, a field oxide layer 34 is formed on the field region of a substrate 30 which defines the field region and an active region. On the active region of one side of the field oxide layer 34, a "V" shape configuration is etched in the center of the active region of the substrate 30. After a gate oxide layer 37 and a gate electrode 38a of the access transistor are laminated on a portion of the recess or cavity region 39, a gate oxide layer 37 and a gate electrode 38b of a drive transistor are formed in lamination on a portion of the active region 40 of the other side of the field oxide layer 34.

Referring to FIG. 10b, the forth embodiment of the present invention is constructed as same as the third embodiment excluding that the active region of one side of the field oxide layer 34 is etched in the shape of a prominence and depression, i.e., rectangular shaped, so as to form a gate oxide layer 37 and a gate electrode 38a of the access transistor.

Figure 11A:
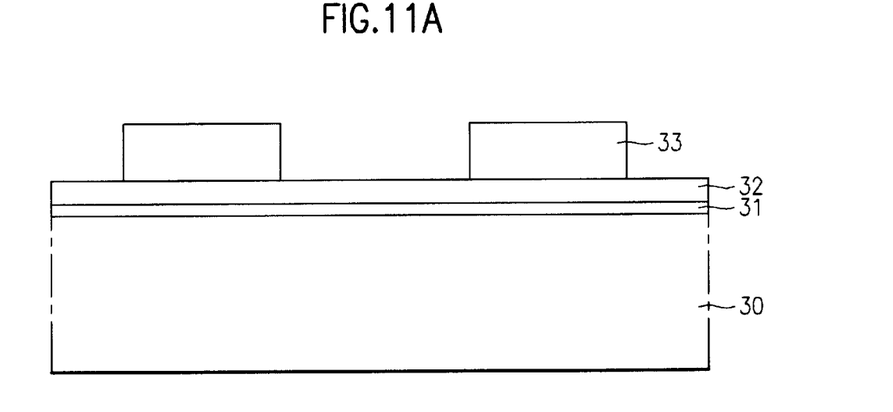
FIGS. 11a–11e are diagrams illustrating the method of fabricating the access and drive transistors of the SRAM cell according to the third preferred embodiment of the present invention.

In the method of fabricating the access transistor and the drive transistor of an SRAM cell according to the third preferred embodiment of the present invention, as shown in FIG. 11a, there are sequentially deposited a first pad oxide layer 31 and a nitride layer 32 on the whole surface of the substrate 30. The first photoresist 33 is then paved on the whole surface of the nitride layer 32 and the paved photoresist 33 is selectively patterned by a photo-etching and a development method.

Figure 11B:
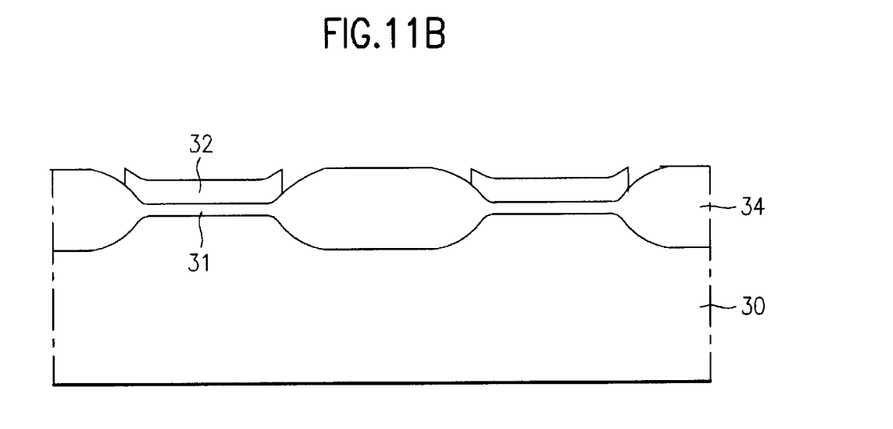

Referring to FIG. 11b, the patterned photoresist 33 is used as a mask in performing anisotropic etching for the exposed nitride layer 32 and then removed. The nitride layer 32 is used as a mask in forming the field oxide layer 34 on the substrate 30 through a heat treatment so as to separate the active region of the access transistor from that of the drive transistor.

Figure 11C:
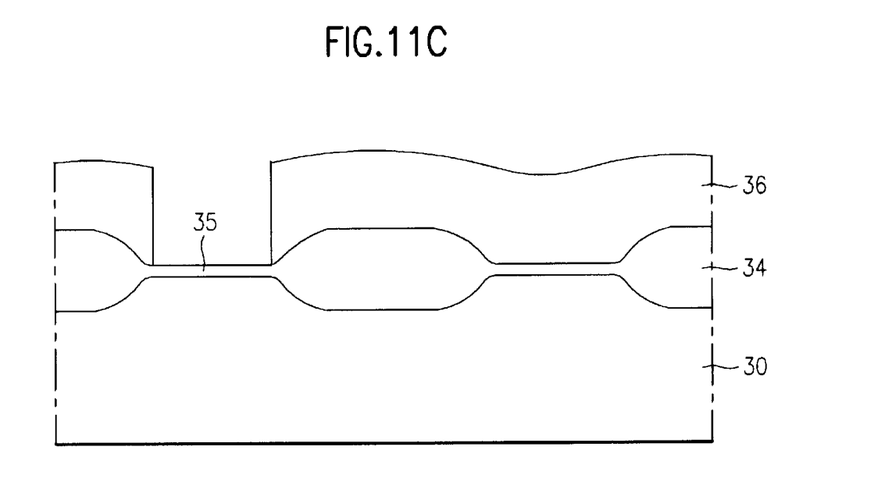

In FIG. 11c, after the nitride layer 32 and the first pad oxide layer 31 are removed, a second pad oxide layer 35 is deposited on the whole surface by a thermal oxidation or a chemical vapor deposition method and channel stop ions are implanted into the active regions of the access transistor and the drive transistor. In succession, the second photoresist is paved and selectively patterned by an exposure and a development method so as to expose the second pad oxide layer 35 on the active region of the access transistor.

Figure 11D:
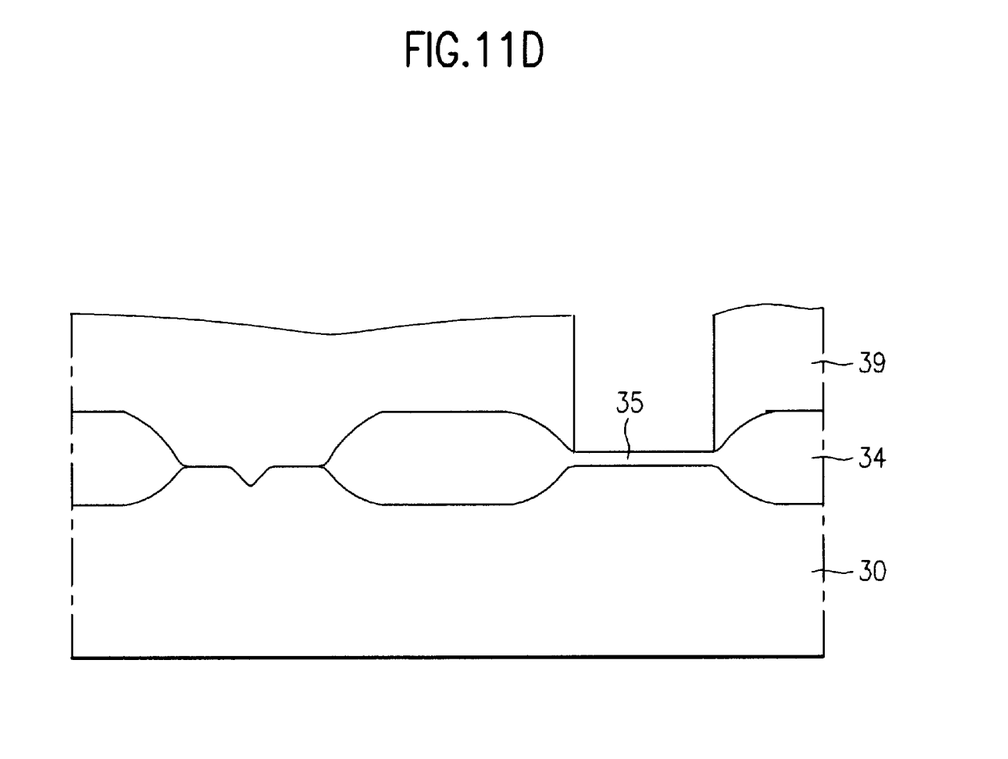

Referring now to FIG. 11d, the exposed second pad oxide layer 35 is removed by an anisotropic etching using the patterned photoresist 36 as a mask. Then, the exposed substrate 30 is etched along the center of a channel of the access transistor by performing anisotropic etching and the second photoresist 36 is removed.

After a third photoresist 39 is paved and selectively removed by an exposure and a development method so as to expose the second pad oxide layer on the active region of the drive transistor. Then, the remaining photoresist 39 is used as a mask in removing the exposed second pad oxide layer 35 by anisotropic etching and the photoresist 39 is removed.

Figure 11E:
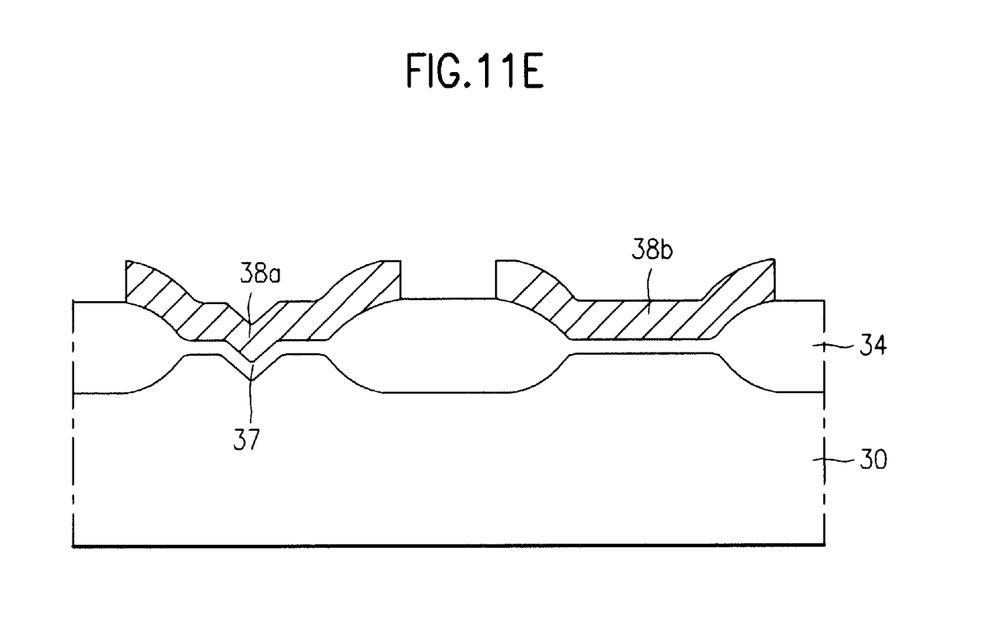

In FIG. 11e, the gate oxide layer 37 is formed by a thermal oxidation or a chemical vapor deposition method and a polysilicon layer is deposited and doped on the gate oxide layer 37.

A forth photoresist is paved on the doped polysilicon layer and selectively removed by an exposure and a development. The remaining photoresist is used as a mask in an anisotropic etching of the polysilicon so as to make at least one groove, i.e., a "V" shape configuration in the center of the access transistor and forming the gate electrode 38a of the access transistor and the gate electrode 38b of the drive transistor so as to form the polysilicon on the grooved region. Then, the source/drain region (not shown) is formed by implanting an impurity on the substrate on each side of the gate electrode 38a of the access transistor and the gate electrode 38b of the drive transistor.

A forth embodiment of the present invention corresponds with the third embodiment, as shown in FIG. 11e, excluding that the substrate of the channel at the active region of the access transistor is etched in the shape of a prominence and depression, i.e., rectangular shaped, and polysilicon layer is formed on an upper side of the uneven substrate so as to form an edge channel at each edge portion on both ends of the substrate.

Figure 12:
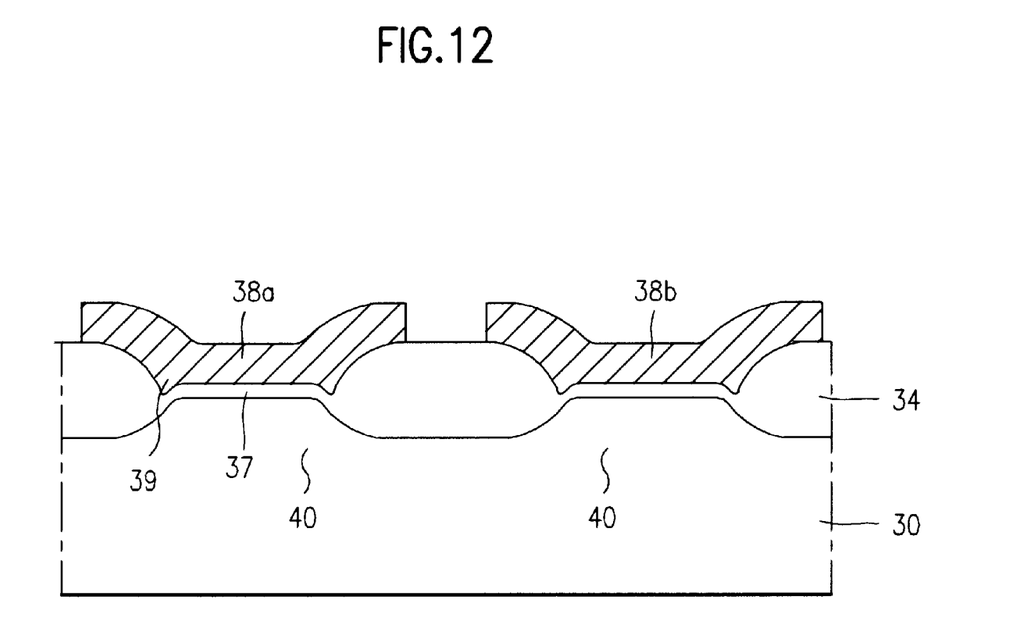
FIG. 12 is a cross sectional view, having the same perspective as FIG. 6, showing the structure of the access and drive transistors of an SRAM cell according to a fifth preferred embodiment of the present invention.

FIG. 12 is a cross sectional view showing the structure of the access transistor and the drive transistor of an SRAM cell according to a fifth preferred embodiment of the present invention and FIGS. 13a–13e are diagrams illustrating the method of fabricating of them.

Referring to FIG. 12, a field oxide layer 34 is formed on the field region of a substrate 30 which defines the field region and an active region 40, and the edge portion 39 of the field oxide layer 34 adjacent to the active region 40 on each side of the field oxide layer 34 is formed in a recess or cavity 39.

A gate oxide layer 37 and a gate electrode 38a of the access transistor are deposited and laminated on a portion of the active region 40, a portion of the field oxide layer 34, and a portion of the edge portion 39 of the access transistor of substrate 30. Then, a gate oxide layer and a gate electrode 38b of the drive transistor are laminated in the same manner as the access transistor.

Figure 13A:
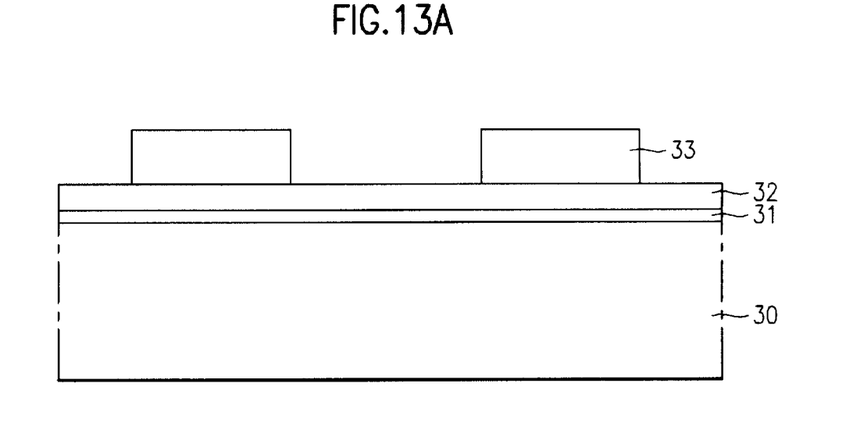
FIGS. 13a–13e are diagrams illustrating the method of fabricating the access and drive transistors of the SRAM cell according to the fifth preferred embodiment of the present invention.

Referring to FIG. 13a, in the method of fabricating the access transistor and the drive transistor of an SRAM cell according to the fifth preferred embodiment of the present invention, a first pad oxide layer 31 and a nitride layer 32 are sequentially deposited on the whole surface of the substrate 30. After paving the first photoresist 33 on the whole surface of the nitride layer 32, the first photoresist 33 is selectively patterned by a photo-etching and a development method.

Figure 13B:
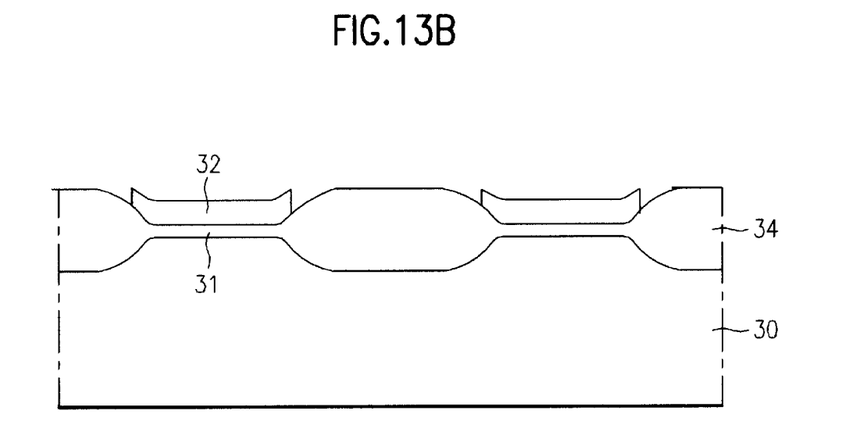

In FIG. 13b, an anisotropic etching is performed on the exposed nitride layer 32 by using the patterned photoresist 33 as a mask and then the first photoresist 33 is removed. The remaining nitride layer 32 is used as a mask for forming the field oxide layer 34 on the substrate 30 by a heat treatment method so as to separate the active region of the access transistor from that of the drive transistor.

Figure 13C:
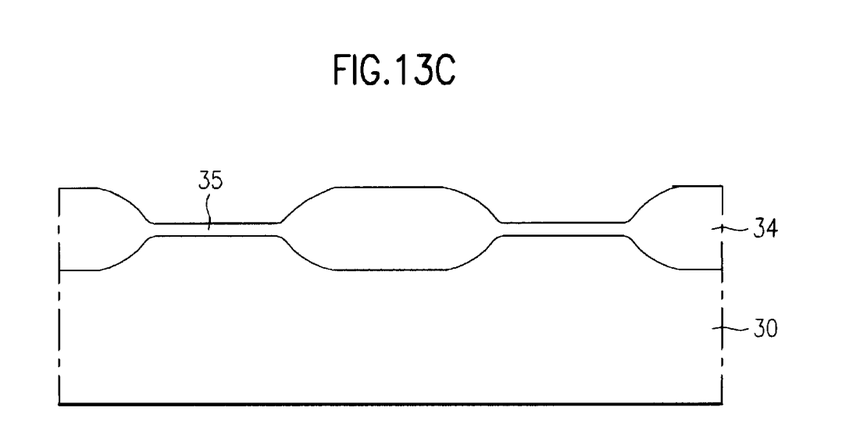

Referring to FIG. 13c, after the nitride layer 32 and the first pad oxide layer 31 are removed, there is formed a second pad oxide layer 35 by a thermal oxidation or a chemical vapor deposition method Then, channel stop ions are implanted into the active regions of the access and drive transistors.

Figure 13D:
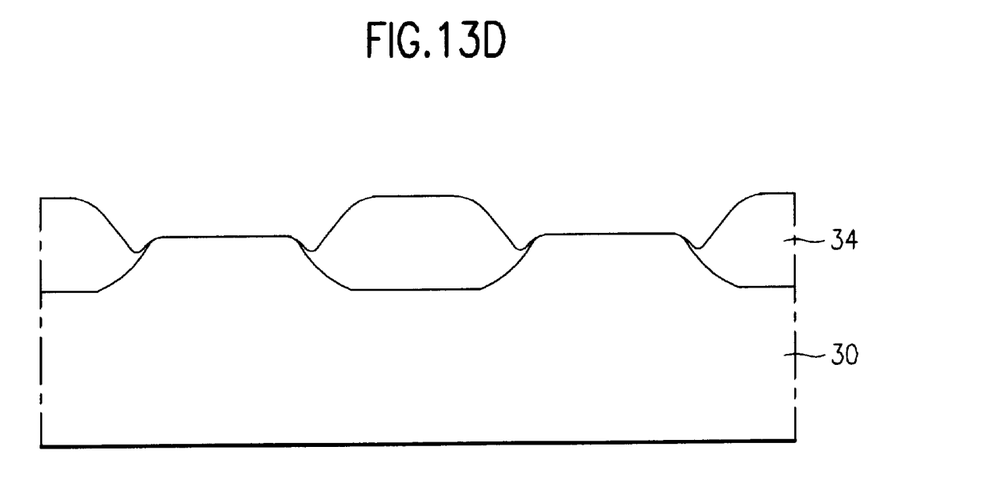

In FIG. 13d, by etching without a mask, the second pad oxide layer 35 is removed and each of the edge portions of the field oxide layer 34 is etched in a recess or cavity 39 so as to form an edge channel therein.

Figure 13E:
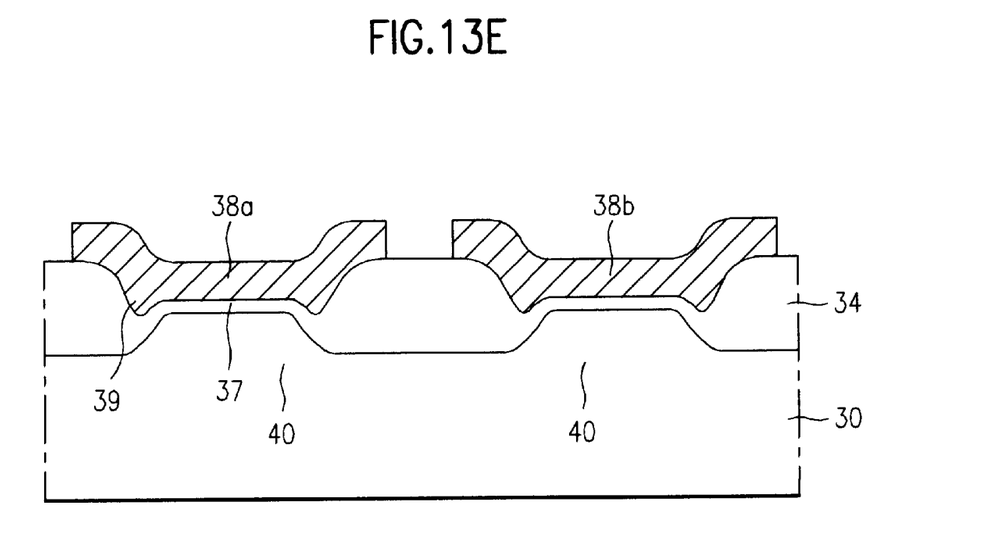

Now in FIG. 13e, there is formed an oxide layer that will form the gate oxide layer 37 through a thermal oxidation or a chemical vapor deposition method. A polysilicon layer is deposited on the oxide layer and doped. The doped polysilicon layer is paved with a photoresist and the photoresist is selectively patterned by an exposure and a development method. Then, the gate electrode 38a of the access transistor and the gate electrode 38b of the drive transistor are formed so as to form a polysilicon layer up to the recess or cavity 39 of the edge portions of the access and drive transistors by using the patterned photoresist as a mask and sequentially etching the polysilicon and the oxide layer. Then, a source/drain region (not shown) is formed by implanting an impurity on the substrate on each side of the gate electrode 38a of the access transistor and the gate electrode 38b of the drive transistor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transistor structure comprising:
   a semiconductor substrate having an active region formed therein and a field oxide region formed thereon, and at least one of said active region and said field oxide region defining a recess region;
   a gate electrode formed on a portion of said active region, on a portion of said field oxide region, and in said recess region; and
   impurity regions formed on either side of said gate electrode in said active region, wherein
      said active region has at least one groove formed therein.

2. The transistor structure of claim 1, wherein said field oxide region and said active region define said recess region along a border of said field oxide region and said active region.

3. The transistor structure of claim 1, further comprising:
   a gate oxide layer formed on said portion of said active region; and
   wherein said gate electrode is laminated on top of said gate oxide layer.

4. The transistor structure of claim 1, wherein said groove has a "V" shape cross-section.

5. The transistor structure of claim 1, wherein said groove has a rectangular shape cross-section.

6. The transistor structure of claim 1, wherein said transistor structure defines at least one transistor in a single SRAM (Static Random Access Memory) cell.

7. The transistor structure of claim 1, wherein said active region has an edge channel portion and a main channel portion, and at least said edge channel portion has channel ions implanted therein for increasing a turn-on voltage of said edge channel portion.

8. The transistor structure of claim 1, wherein said recess region includes two grooves.

9. The transistor structure of claim 8, wherein said two grooves are formed at two respective boundaries between said active region and said field oxide region.

10. A two transistor structure comprising:
    a semiconductor substrate having a first and second active region formed therein and a field oxide region formed thereon, at least one of said first active region and said field oxide region defining a first recess region;
    a first gate electrode formed on a portion of said first active region, on a portion of said field oxide region, and in said first recess region;
    a second gate electrode formed on a portion of said second active region;
    first and second impurity regions formed in a first and second portion of said first active region on either side of said first gate electrode; and
    third and fourth impurity regions formed in a third and fourth portion of said second active region on either side of said second gate electrode, wherein
    said first active region has at least one groove formed therein.

11. The two transistor structure of claim 10, wherein said first and second active region defines an access and drive transistor, respectively, of a single cell SRAM (Static Random Access Memory).

12. The two transistor structure of claim 11, wherein at least one of said second active region and said field oxide region define a second recess region.

13. The two transistor structure of claim 12, wherein said second gate electrode is formed on a portion of said second active region and a portion of said second recess region.

14. A transistor structure comprising:
    a semiconductor substrate having an active region formed therein and a field oxide region formed thereon, said active region having an edge channel portion and a main channel portion, and at least said edge channel portion having channel ions implanted therein for increasing a turn-on threshold voltage of said edge channel portion;
    a gate electrode formed on a portion of said active region, on a portion of said field oxide region, and in said field oxide region; and
    impurity regions formed on either side of said gate electrode in said active region, wherein
    said active region has at least one groove formed therein.

* * * * *